United States Patent [19]

Brooks

[11] 4,109,632

[45] Aug. 29, 1978

[54] GTO IGNITION CIRCUIT

[75] Inventor: Ronald Robert Brooks, Trenton, N.J.

[73] Assignee: RCA Corporation, New York, N.Y.

[21] Appl. No.: 737,916

[22] Filed: Nov. 1, 1976

[51] Int. Cl.[2] .......................... F02P 7/00; H03K 17/72

[52] U.S. Cl. ............................ 123/148 E; 307/252 C; 307/305; 315/209 SC; 331/111

[58] Field of Search .................... 123/148 E, 148 AC; 307/252 C, 252 A, 252 R, 252 J, 305; 331/111; 315/209 SC

[56] References Cited

U.S. PATENT DOCUMENTS

| | | | |
|---|---|---|---|
| 3,306,274 | 2/1967 | Motto, Jr. et al. | 123/148 E |
| 3,308,800 | 3/1967 | Motto, Jr. et al. | 307/252 C |
| 3,327,164 | 6/1967 | Steinberg et al. | 315/209 SC |
| 3,459,164 | 8/1969 | Gilbert | 123/148 E |
| 3,461,345 | 8/1969 | Gilbert | 123/148 E |
| 4,001,607 | 1/1977 | Dietz | 307/252 C |
| 4,016,433 | 4/1977 | Brooks | 123/148 E |

*Primary Examiner*—Charles J. Myhre
*Assistant Examiner*—Andrew M. Dolinar
*Attorney, Agent, or Firm*—H. Christoffersen; A. L. Limberg; John M. O'Meara

[57] ABSTRACT

A constant duration and level of spark is obtained over a wide range of engine speeds in an ignition circuit, including a gate-turn-off device having a main current path connected in series with the primary winding of an ignition coil. An operating voltage is selectively applied, in timed relation to the operation of the internal combustion engine, to an LC resonant circuit for shocking the resonant circuit into oscillation. These oscillations are applied to the gate electrode of the gate-turn-off device, turning the gate-turn-off device off and on each successive half cycle, for inducing a relatively high level spark voltage in the secondary winding of the ignition coil.

15 Claims, 1 Drawing Figure

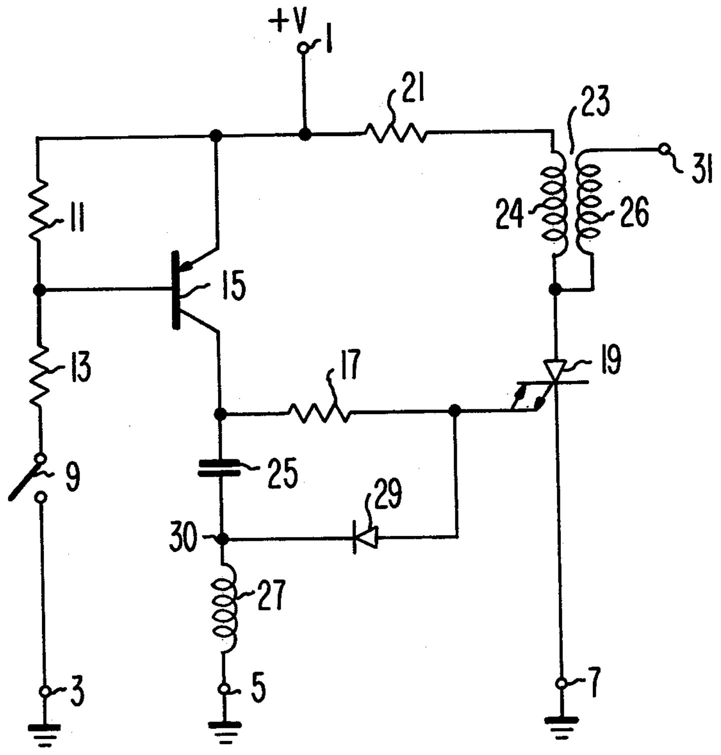
+V
1
21
23
31
11
24
26
15
13
17
19
9
25
29
30
27
3
5
7

GTO IGNITION CIRCUIT

The field of the subject invention is related generally to ignition circuits, and more specifically to an ignition circuit including a gate-turn-off silicon controlled rectifier (i.e. a GTO SCR or simply GTO) for controlling the flow of current through the primary winding of an ignition coil.

Modern internal combustion engines must be capable of operating efficiently at high engine speeds, with minimum emission of pollutants into the atmosphere, while maintaining the performance of the engine. Many of the standard electro-mechanical ignition systems experience a significant decrease in available sparkplug voltage or spark energy and spark duration with increasing engine speed. A partial solution to this problem has been the development of capacitive discharge ignition systems. In general the capacitive discharge systems tend to be rather complex and, as a result, costly. Accordingly, the present ignition circuit was invented for providing substantially the same improvements of performance in ignition provided by the capacitive discharge system, while providing a much simpler and cheaper circuit.

In the present inventive circuit, an operating voltage is selectively applied across a serially connected capacitor and inductor, in timed relation to the operation of engine, for causing a transitory oscillation in the resonant circuit they form. The transient oscillation is initially applied through a unidirectionally conductive element to the gate electrode of a gate turn-off device for turning off the device, and for interrupting the flow of current in the primary winding of an ignition coil, for inducing a spark voltage in the secondary winding of the coil. Thereafter, the capacitor having been charged by the transitory oscillation, is dc coupled to the gate electrode for discharging into the gate electrode, for turning on the gate turn off device, such operation being repetitive for each cycle of operation.

In the drawing, the single FIGURE is a schematic diagram showing the circuit of the ignition system of the present invention.

When the ignition switch (not shown) of a motor vehicle, for example, is placed in the run position, the battery voltage +V is applied to the operating voltage terminal 1 (referring to the schematic diagram). Reference voltage terminals 3, 5, and 7, are each connected to a point of reference potential, the vehicle ground or chassis ground in this example. With the operating voltage +V so applied across the circuit, when the breaker points 9 of the distributor close at particular degrees of rotation of the crankshaft of the engine, the breaker points 9 being opened and closed in timed relationship to the operation of the engine, a closed current path between terminals 1 and 3 is formed including resistors 11 and 13 of the resistive voltage divider circuit. As a result, current will flow through this current path from terminal 1 to terminal 3, causing a voltage drop across resistor 11, sufficiently large to switch bipolar transistor 15 into conduction as between its emitter and collector electrodes. The first time transistor 15 is switched into conduction, when the engine is just being started, the crankshaft is in its first rotation, current will flow from terminal 1 through transistor 15 and resistor 17, through the gate-cathode electrode current path of the gate-turn-off silicon controlled rectifier 19, and through terminal 7 to chassis ground (hereinafter referred to as ground).

In response to the positive current supplied to its gate electrode, GTO 19 will be triggered into conduction causing the impedance between its anode and cathode electrodes to go from a relatively high level to a very low level, permitting current to flow through the current path including ballast resistor 21, the primary winding 24 of the ignition coil 23, the anode-cathode path through GTO 19, and reference terminal 7, to ground. Substantially concurrent with GTO 19 being triggered into conduction, a portion of the current flowing through the collector-emitter current path of transistor 15 will flow through the series resonant circuit of capacitor 25 and inductor 27 and through terminal 5, to ground. The abrupt injection of current into this series resonant circuit will "shock" the resonant circuit into transitory oscillation, because of the high-Q of the circuit. At the beginning of this oscillation the voltage 30 at the interconnection 30 of elements 25, 27 is positive and a self-induced field is built up in the inductor during the former half of the initial full half cycle of oscillation. This induced field in inductor 27 collapses during the latter half of the initial full half cycle of oscillation, so that current continues to flow through the inductor 27 from interconnection 30 to render $V_{30}$ negative which forward biases diode 29 and withdraws sufficient gate current from GTO 19 to cause it to turn off and to cease conduction through its anode-cathode path.

The interruption of current through the primary winding 24 of the ignition coil 23 when the GTO 19 turns off will cause the field in winding 24 to collapse which induces a very high voltage or spark voltage across the secondary winding 26 of the ignition coil 23 after each closing of the breaker points 9 except the initial closing thereof when starting the engine. This spark voltage should appear at output terminal 31 for about 150 to 200 microseconds, the duration of the spark voltage being dependent upon the values of the capacitor 25 and inductor 27, and the Q of the resonant circuit they form. The maximum voltage is not induced across the secondary winding 26 for the initial closing of the breaker points 9 because the field of primary winding 24 cannot build before that closing in the manner accomplished by the circuit of the invention as will be explained below.

The negative transition of $V_{30}$ also charges capacitor 25 to a level such that the voltage appearing across capacitor 25 will become substantially more positive than the level of the operating voltage +V. This causes the collector-base junction of transistor 15 to become forward biased, so that current flows between the collector, and base electrodes of transistor 15 and the resistive network at the base of transistor 15, rather than between the collector and emitter electrodes of transistor 15. In the former half of the next or final half cycle of the transistor oscillation, capacitor 25 discharges to cause the current in inductor 27 to reverse direction so that $V_{30}$ becomes positive. As the latter half of this final half cycle starts, $V_{30}$ swings positive, causing diode 29 will be reverse-biased and cease conduction. Capacitor 25 then continues discharging through the current path including inductor 27 and coupling resistor 17 into the gate-cathode current path of the GTO 19, turning the GTO back on, causing current once again to flow through the primary winding 24, as it did during the former half of the initial half cycle of oscillation. In this manner, current again flows through the primary winding 24, even though the points 9 may have opened, thereby extending the dwell time for building the field of the primary winding 24 independently of breaker point 9 operation, resulting in a very high spark voltage when that field collapses and high-speed performance. Subsequent to the start of each transitory oscillation, the breaker points 9 do open, interrupting the flow of current through the resistive voltage divider 11, 13. In response to the interruption of this current, transistor 15 will turn off or will not turn back on after the collector-base junction has been forward biased as previously discussed. With transistor 15 now being non-conductive, capacitor 25 will completely discharge itself through the gate-cathode current path of GTO 19. After the initial rotation of the crankshaft of the engine, with the engine running, the GTO 19 will continue to be turned on and off in the manner described, for providing a spark voltage in the secondary winding 26 at appropriate times.

A shorter firing time or duration of spark will be obtained for values of the capacitor 25 and inductor 27 providing a higher frequency of oscillation of the transitory oscillation. Similarly, if these values are chosen to provide a relatively lower frequency of oscillation of the transitory signal, a longer firing time or duration of the spark voltage will be obtained, because the duration of the negative-going half cycle of the transitory signal will be extended.

The present inventive circuit provides a substantially constant duration and level of spark over a wide range of engine speeds, including those engine speeds normally encountered in the everyday operation of a vehicle.

The breaker points of a conventional ignition system, are closed for a period of time designated as the dwell time (measured in degrees of crankshaft rotation), in order to put energy into or cause current to flow through the primary winding of the ignition coil, the points being opened to cause a spark voltage to be induced into the secondary winding of the ignition coil. In the circuit shown, on the other hand the breaker points 9 are closed to initiate the production of a spark voltage in the secondary winding of the ignition coil, and the dwell time is the period of time that GTO 19 is enabled for conduction, to permit current flow through primary winding 24. Furthermore, the spark firing time is well-defined to be substantially equal to one half of a resonant cycle that occurs during the later half of the initial half cycle and the former half of the final half cycle in each resonant cycle. The position of the crankshaft at the time at which the breaker points 9 are operated to produce a spark voltage, expressed in the number of degrees the crankshaft of the engine has rotated from top dead center or uppermost position of a piston head within a cylinder of the engine, is commonly used to describe the "timing" of the engine.

The breaker points 9 can readily be replaced by any switching means responsive to the timing of the engine. For example, such switching means might be the reluctance type transducers or transducer systems now replacing the mechanical breaker points in many of the new autombiles. Also, transistor 15, the resistive voltage divider 11, 13, and the breaker points 9, can be replaced by any other switching means capable of applying the operating voltage +V to the common connection of the resistor 17 and capacitor 25, in timed relation to the operation of the engine.

Because of the relative simplicity of the present ignition circuit, its application is not intended to be limited for automotive use, and can be extended for use in such items as a starting or ignition circuit for a gas dryer, a gas oven, a gas furnace, spark igniter for a jet engine, and so forth. The only modification that would need be made to the present inventive circuit for such application, would be to replace the breaker points 9, for example, with a switching means capable of turning transistor 15 on and off at appropriate times, for obtaining a spark voltage at output terminal 31 when desired.

It should be noted the GTO is a bistable switching device. Presently available GTO's are of a conductivity type (PNPN) requiring application of a sufficient level of positive voltage to their gate electrodes with respect to their cathodes, for turning them on. Once turned on, they will remain on even if the gate voltage is removed. A negative voltage applied to their gate electrodes will turn off the GTO's, provided the voltage is of sufficient amplitude, and may thereafter be removed, the GTO's remaining non-conductive. In this manner, GTO's provide bistable switching. Diode 29 is poled to conduct and connect a negative turn-off signal to the gate of GTO 19, for turning off the GTO. If a GTO of opposite conductivity type (NPNP) is used, diode 29 must be poled in the opposite direction, the operating voltage must be made negative (−V applied to terminal 1), and transistor 15 must now be of an NPN conductivity type. A GTO of opposite conductivity type requires the application of a negative voltage to its gate, with respect to its anode, for turning it on, and a positive voltage, for turning it off.

What is claimed is:

1. An ignition circuit for an internal combustion engine, comprising:

first and second terminals for receiving an operating voltage and a reference voltage, respectively;

timing switch means responsive to the crankshaft position of the engine selectively to provide a conductive path between said first terminal and a third terminal;

a capacitor connected between said third and a fourth terminal;

an inductor connected between said fourth and second terminals in a series resonant circuit with said capacitor and responding to conduction of said timing switch means to build up a self-induced field;

bistable switching means having a control electrode and having a selectively conductive main current path which becomes conductive after sufficiently large current of a first polarity is applied to said control electrode and non-conductive after sufficiently large current of a second polarity opposite to said first polarity is applied to said control electrode;

an ignition coil having primary and secondary windings with said primary winding being connected in series with said main current path of said bistable switching means between said first and second terminals;

a resistor connected between said third terminal and the control electrode of said bistable switching means; and unidirectionally conductive means connected between said fourth terminal and the control electrode of said bistable switching means with a poling to conduct the current supplied by said inductor during collapse of its self-induced field.

2. The ignition circuit of claim 1, wherein said bistable switching means includes a gate-turn-off silicon controlled rectifier, said controller rectifier having a gate electrode as said control electrode and having an anode and cathode electrodes between which said main current path exists.

3. The ignition circuit of claim 1, wherein said timing switch means includes:

transistor means having a main current path connected between said first terminal and third terminals and having a control electrode; and engine sychronized cycling means connected between said first and second terminals, for applying signals at said control electrode of said transistor means to control the selective conduction of its main current path.

4. The ignition circuit of claim 3, wherein said engine sychronized cycling means includes:

resistive voltage divider means having an output terminal connected to said control electrode of said transistor means; and breaker points selectively connecting said voltage divider means between said first and second terminals, said breaker points being opened and closed responsive to the crankshaft position of the engine to produce said signals at said output terminal.

5. The ignition circuit of claim 3, wherein said transistor means includes a bipolar transistor having a base electrode as said control electrode, an emitter electrode connected to said first terminal, and a collector electrode connected to the said third terminal, said base electrode being receptive of said signals, said main current path being between said emitter and collector electrodes.

6. An ignition circuit for an internal combustion engine having a crankshaft, comprising:

first and second terminals for receiving an operating and a reference voltage, respectively;

a gate-turn-off bistable switching device having an anode electrode, a cathode electrode connected to said second terminal, and a gate electrode;

an ignition coil having a primary winding coupled between said anode electrode and said first terminal, and a secondary winding;

a series circuit including a resistor having one end connected to said gate electrode, an inductor having one end connected to said second terminal, and a capacitor between the other ends of said resistor and inductor, said capacitor forming a resonant circuit with said inductor;

a diode having an anode electrode connected to said gate electrode, and a cathode electrode connected to the common connection of said capacitor and inductor; and switching circuit means connected between said first terminal and the common connection of said resistor and capacitor, responsive to predetermined degrees of crankshaft rotation of said engine, for applying successive timing signals to said common connection, the first one of said timing signals turning on said gate-turn-off-device, each one of said timing signals creating a transitory oscillation in said resonant circuit, the first negative half-cycle of said oscillation acting to forward bias said diode into conduction, causing current to flow from said gate electrode through the conduction path including said diode and inductor, turning off said bistable switching device, thereby interrupting the flow of current in said primary winding, causing a relatively high voltage to be induced into said secondary winding, the first negative half-cycle of said oscillation also acting to charge said capacitor to a level where the voltage across said capacitor is greater than said operating voltage, thereafter, when the potential of said oscillation reverses polarity, said diode now being reverse biased into non-conduction, said capacitor discharges via said resistor into said gate electrode, for turning on said bistable switching device, said cycle being repetitive for each successive one of said timing signals.

7. The ignition circuit of claim 6, wherein said switching circuit means includes:

current control means having a normally non-conductive main current path connected between said first terminal and the common connection of said resistor and capacitor, and a control electrode receptive of control signals for rendering said main current path conductive; and control signal generating means connected between said first and second terminals, for applying said control signals to said control electrode of said current control means, whenever said crankshaft turns through a predetermined number of degrees.

8. The ignition circuit of claim 7, wherein said current control means includes a transistor having a base electrode as said control electrode, and having a main current path between an emitter electrode thereof connected to said first terminal and a collector electrode thereof connected to the common connection of said resistor and capacitor.

9. The ignition circuit of claim 7, wherein said control signal generating means includes:

a pair of series connected resistors, the common connection of which is connected to said control electrode; and breaker points selectively connecting said pair of resistors between said first and second terminals, said breaker points closing at the predetermined crankshaft positions, for generating said control signals at the common connection of said pair of resistors.

10. The combination comprising:

first and second supply terminals for receiving an operating voltage, and a reference voltage, respectively;

an ignition coil having a primary winding, and a secondary winding;

bistable switching means having a main current path connected in series with said primary winding between said first and second supply terminals, and a control electrode;

resonant circuit means having a capacitor connected between first and second output terminals and having an inductor connected between said second output terminal and said second supply terminal, said first output terminal being d.c. coupled to said control electrode, and said second output terminal being unidirectionally d.c. coupled to said control electrode; and initiating means connected between said first and second supply terminals, including means for alternately applying said operating voltage across said resonant circuit at predetermined times, each such application causing said resonant circuit means to go into transitory oscillation with a voltage being produced initially at said first output terminal to turn off said bistable switching means which interrupts the flow of current in said primary winding, thereby inducing a relatively high spark voltage in said secondary winding, and a voltage being subsequently produced at said second output terminal to turn on said bistable switching means.

11. A combination as set forth in claim 10, wherein said bistable switching means includes a gate-turn-off silicon controlled rectifier having a gate electrode for said control electrode, and a main current path including a cathode electrode connected to said second supply terminal, and an anode electrode.

12. A combination as set forth in claim 10, further including:

a resistor connected between said first output terminal and said control electrode of said bistable switching means, providing d.c. coupling therebetween; and a diode having an anode electrode connected to said control electrode, and a cathode electrode connected to said second output terminal, said diode when forward biased acting to d.c. couple said control electrode to said second output terminal, said diode when backbiased acting to isolate said control electrode from said second output terminal.

13. The ignition circuit of claim 10, wherein said initiating means includes:

transistorized switching means having a main current path connected between said first supply terminal and said first output terminal of said resonant circuit means, and a control electrode; and cycling means connected between said first and second supply terminals, for applying a control signal to said control electrode of said transistorized switching means to turn on the latter for a predetermined time, and then terminating said control signal after a spark voltage is induced in said secondary winding of said ignition coil.

14. The ignition circuit of claim 13 wherein said cycling means includes:

resistive voltage divider means having an output terminal connected to said control electrode of said transistorized switching means; and breaker points selectively connecting said voltage divider means between said first and second supply terminals, said breaker points being opened and closed each time said relatively high spark voltage is desired in said secondary winding.

15. An ignition circuit for an internal combustion engine, comprising:

a capacitor;

an inductor connected in series resonant circuit with said capacitor;

timing switch means for selectively connecting said series resonant circuit between an operating voltage and a reference voltage;

bistable switching means having a control electrode and having a selectively conductive main current path which becomes conductive after sufficiently large current of a first polarity is applied to said control electrode and non-conductive after sufficiently large current of a second polarity opposite to said first polarity is applied to said control electrode;

an ignition coil having primary and secondary windings with said primary winding being connected in series with said main current path of said bistable switching means between said operating voltage and said reference voltage;

a resistor connected between the interconnection of said timing switch means with said series resonant circuit and the control electrode of said bistable switching means; and unidirectionally conductive means connected between the interconnection of said capacitor with said inductor and the control electrode of said bistable switching means with a poling to conduct current of said second polarity to said control electrode of said bistable switching means;

said resonant circuit being excited into oscillation when said timing switch means becomes conductive, said inductor building up a self-induced field therein during the initial portion of each said oscillation, said self-induced field collapsing during an intermediate portion of each said oscillation to supply a sufficiently large current of said second polarity through said unidirectionally conductive means to charge said capacitor and render said main current path of said bistable switching means non-conductive, the flow of current through said primary winding being interrupted to induce a relatively high spark voltage in said secondary winding when said main current path of said bistable switching means becomes non-conductive, said capacitor discharging through said resistor in a final portion of each said oscillation to apply a sufficiently large current of said first polarity to said control electrode of said bistable switching means to re-establish conduction of its main current path along with current flow through said primary winding, said timing switch means becoming non-conductive at any time after each said oscillation is excited thereby in as much as the conductivity of said bistable switching means is only controlled by the occurrence of said intermediate and final portions during each said oscillation.

* * * * *

UNITED STATES PATENT AND TRADEMARK OFFICE
CERTIFICATE OF CORRECTION

PATENT NO. : 4,109,632

DATED : August 29, 1978

INVENTOR(S) : Ronald Robert Brooks

It is certified that error appears in the above-identified patent and that said Letters Patent is hereby corrected as shown below:

IN THE SPECIFICATION

Column 2, line 61, "will" should be --to--.

Column 3, line 5, after "and" insert --enhanced--.

IN THE CLAIMS

Claim 5, line 5, delete "the".

Signed and Sealed this

*First* Day of *May 1979*

[SEAL]

*Attest:*

RUTH C. MASON
*Attesting Officer*

DONALD W. BANNER
*Commissioner of Patents and Trademarks*